(12) United States Patent
Bianchi et al.

(10) Patent No.: US 7,466,647 B2
(45) Date of Patent: Dec. 16, 2008

(54) EFFICIENT MUXING SCHEME TO ALLOW FOR BYPASS AND ARRAY ACCESS

(75) Inventors: Andrew James Bianchi, Austin, TX (US); Eric Jason Fluhr, Round Rock, TX (US); Masood Ahmed Khan, Cedar Park, TX (US); Michael Ju Hyeok Lee, Austin, TX (US); Edelmar Seewann, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 675 days.

(21) Appl. No.: 11/054,287

(22) Filed: Feb. 9, 2005

(65) Prior Publication Data

US 2006/0198297 A1 Sep. 7, 2006

(51) Int. Cl.
*G01R 31/08* (2006.01)
*G06F 13/28* (2006.01)
*G06F 12/00* (2006.01)
*G06F 9/26* (2006.01)

(52) U.S. Cl. .................. 370/222; 370/535; 710/23; 711/138; 711/207

(58) Field of Classification Search ............... 370/217, 370/221; 326/39, 40, 41; 711/207, 138
See application file for complete search history.

(56) References Cited

U.S. PATENT DOCUMENTS

| 5,421,000 | A * | 5/1995 | Fortino et al. ............... 711/118 |
| 5,572,535 | A * | 11/1996 | Pixley et al. ................ 714/724 |
| 5,828,475 | A * | 10/1998 | Bennett et al. ............... 398/52 |
| 6,233,652 | B1 * | 5/2001 | Mathews et al. ............ 711/108 |
| 6,549,997 | B2 * | 4/2003 | Kalyanasundharam ...... 711/207 |
| 6,594,728 | B1 * | 7/2003 | Yeager ....................... 711/127 |
| 2004/0162961 | A1 * | 8/2004 | Lyon .......................... 711/207 |

* cited by examiner

*Primary Examiner*—Steven H. D Nguyen
*Assistant Examiner*—Thinh D Tran
(74) *Attorney, Agent, or Firm*—Duke W. Yee; Diana K. Gerhardt; Theodore D. Fay, III

(57) ABSTRACT

A method and apparatus for using a 2:1 MUX to control read access, data bypass, and page size bypass in a memory array. The mechanism of the present invention reduces the 3:1 MUX normally required to manage these three functions to a 2:1 MUX.

3 Claims, 2 Drawing Sheets

EFFICIENT MUXING SCHEME TO ALLOW FOR BYPASS AND ARRAY ACCESS

BACKGROUND OF THE INVENTION

1. Technical Field

The present invention relates generally to an improved data processing system and in particular to a method and apparatus for processing data. Still more particularly, the invention relates to an efficient muxing scheme to allow for bypass and array access in memory arrays.

2. Description of Related Art

In modern data processing systems, data is read from and stored into arrays of memory cells. One type of memory is a cache, which serves as temporary memory for recently used data. In addition, data is stored in collections referred to as pages. Page sizes are typically about four kilobytes, though a page may vary in size from a few bytes to several megabytes. Thus, pages of data are read from and stored into caches of one or more arrays of memory cells.

In certain array designs, bypassing an array and forwarding data is often needed when data flows from other components of a data processing system. Bypassed data is forwarded to an output before writing to the array. Depending on the page size, certain bits accessed from an array are bypassed rather than using the read values of the array. For example, for large pages, only certain data is read and the rest of the data may bypass the array. Thus, while managing data flow in a data processing system, the data processing system supports read access to the array, bypassing of data past the array, and bypassing of some data past the array based on page size. These three functions may be referred to as read access, data bypass, and page size bypass.

For example, if a page contains ten bits of information, a read access operation causes all ten bits of information to be read from an array. In a data bypass operation, all ten bits of information skip the array and are bypassed directly to an output. In an exemplary page size bypass operation, two of the ten bits are bypassed and the other eight bits are read. The two bits are bypassed because those bits need not be read.

In order to support read access, data bypass, and page size bypass, a three to one multiplexer (3:1 MUX) is required for prior art arrays. However, a 3:1 MUX requires relatively complex control circuitry and requires more physical space to implement on hardware. Thus, it is desirable to reduce the complexity of the MUX and implement a two to one MUX (2:1 MUX).

SUMMARY OF THE INVENTION

The present invention provides a method and apparatus for managing flow of data in a data processing system. The data processing system includes a 2:1 multiplexer that manages a bypass function, an array read function, and a page bit bypass function. Performing these three functions normally requires a 3:1 multiplexer.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
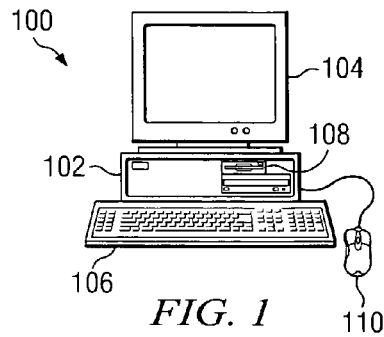
FIG. 1 is a pictorial representation of a data processing system in which the present invention may be implemented.

With reference now to the figures and in particular with reference to FIG. 1, a pictorial representation of a data processing system in which the present invention may be implemented is depicted in accordance with a preferred embodiment of the present invention. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

Figure 2:
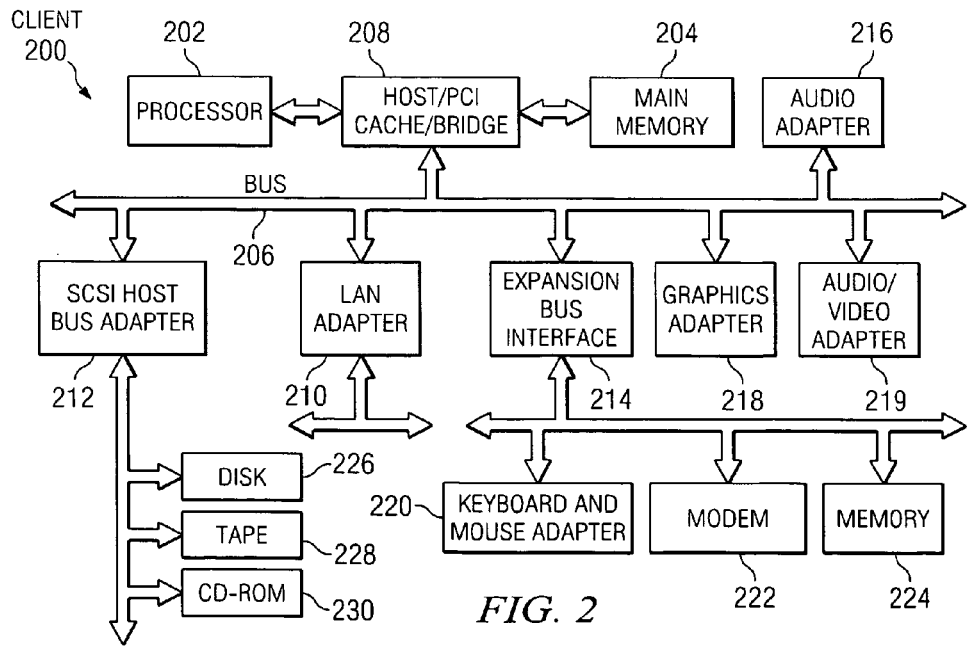
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in connectors. In the depicted example, local area network (LAN) adapter 210, small computer system interface (SCSI) host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows XP, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226-230.

The present invention provides a method and apparatus for using a 2:1 MUX to control the three functions of read access, data bypass, and page size bypass in a memory array. The mechanism of the present invention takes advantage of the commonality of data bypass and page size bypass to reduce the 3:1 MUX normally required to manage these three functions to a 2:1 MUX.

Figure 3:
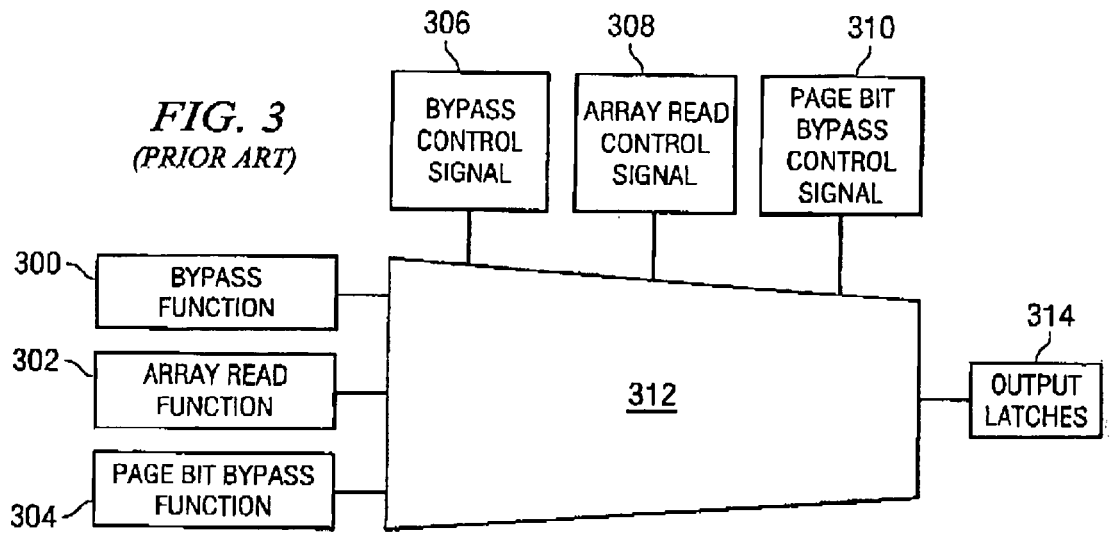
FIG. 3 is a block diagram of a prior art 3:1 MUX.

FIG. 3 is a block diagram of a prior art 3:1 MUX. The 3:1 MUX may be implemented in main memory 204, processor 202, or memory 224 in the data processing system of FIG. 2. For most data processing systems that support the three functions of bypass function 300, array read function 302, and page bit bypass function 304, three control signals are required. The three control signals are bypass control signal 306, array read control signal 308, and page bit bypass control signal 310. Each of control function 306, 308, and 310 are provided by a control signal mechanism. The three control functions are provided as input into a three to one multiplexer (3:1 MUX) 312. In turn, 3:1 MUX 312 is adapted to select which function of functions 300, 302, and 304 controls data flow based on control signals 306, 308, and 310. The output of 3:1 MUX 312 is provided to output latches 314, with further processing performed on the passed data as needed.

Figure 4:
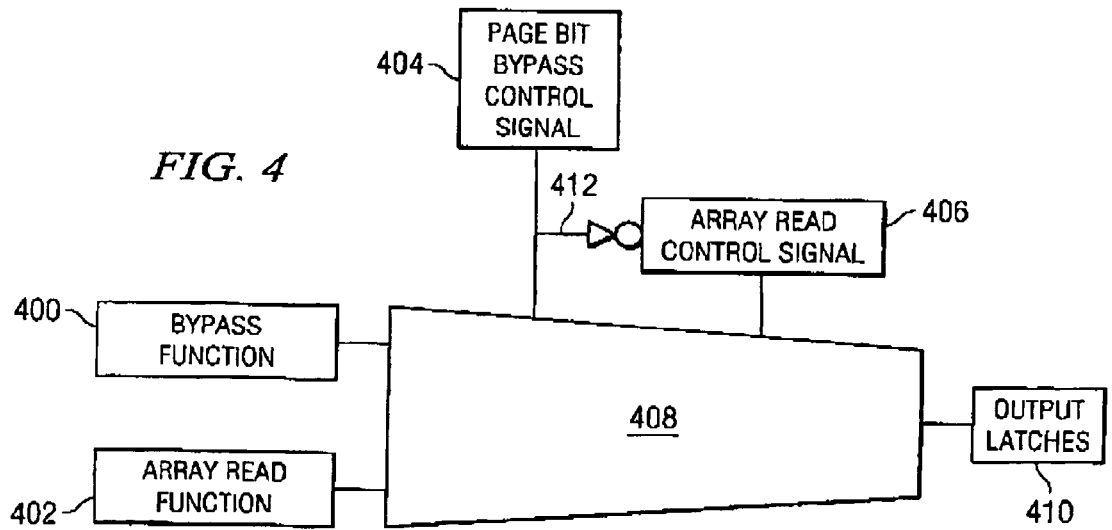
FIG. 4 is a block diagram of a 2:1 MUX, in accordance with a preferred embodiment of the present invention.

FIG. 4 is a block diagram of a 2:1 MUX, in accordance with a preferred embodiment of the present invention. The 2:1 MUX may be implemented in main memory 204, processor 202, or memory 224 in the data processing system of FIG. 2. Because of the commonality between a normal bypass and a page bit bypass, and because the three functions are orthogonal to each other, the 3:1 MUX shown in FIG. 3 may be reduced to a two to one multiplexer (2:1 MUX) shown in FIG. 4.

In the system shown in FIG. 4, 2:1 MUX 408 supports two functions, bypass function 400 and array read function 402. However, as shown below, bypass function 400 includes both a regular bypass function, such as bypass function 300 in FIG. 3, and a page bit bypass function, such as page bit bypass function 304 in FIG. 3. Thus, 2:1 MUX 408 effectively supports the three functions, 300, 302, and 304, shown in FIG. 3.

Bypass control function 400 and array read function 402 are provided as input into 2:1 MUX 408. The two control signals, page bit bypass control signal 404 and array read control signal 406, are also provided to 2:1 MUX 408. Each of control signals 404 and 406 are provided by control signal mechanisms. Based on control signals 404 and 406, 2:1 MUX 408 selects which function is used to control data flow in the system. The output of 2:1 MUX 408 is provided to output latches 310, with further processing performed on the output data as needed.

Line 412 connects the page bit control signal to array read control signal 406. Line 412 indicates that the page bit control signal may be used to indicate when an array read should take place. In an illustrative example, page bit bypass control signal 404 is set to a default value of zero. Thus, if a page bit in the array is not accessed, then bypass function 400 is automatically selected by 2:1 MUX 408.

Continuing the illustrative example, if a page bit in the array is accessed, and if the page bit value is zero, then the particular data associated with the page bit is bypassed. Thus, 2:1 MUX 408 effectively selects page bit bypass function 304 shown in FIG. 3. When the array is not accessed, the page bit will be at its default pre-charged value of zero; thus, the bypass function is still selected. On the other hand, if a page bit in the array is accessed, and if the page bit value is one, then the particular data associated with the page bit is read from the array. Thus, array read function 402 is performed. As seen from the above example, 2:1 MUX 408 can effectively perform the functions of 3:1 MUX 312.

Figure 5:
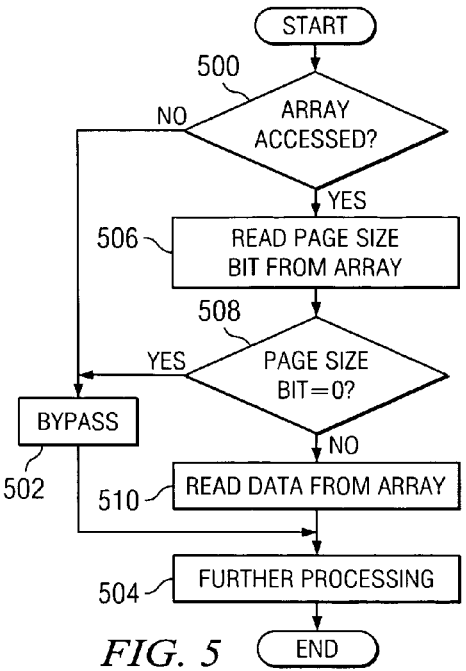
FIG. 5 is a flowchart illustrating the operation of the 2:1 MUX shown in FIG. 4, in accordance with a preferred embodiment of the present invention.

FIG. 5 is a flowchart illustrating the operation of the 2:1 MUX shown in FIG. 4, in accordance with a preferred embodiment of the present invention. The process begins with a determination of whether a memory array has been accessed (step 500). If the memory array has not been accessed, then all of the data bypasses the array (step 502). From there, data flows to other parts of the data processing system for further processing (step 504), with the process terminating thereafter.

If the array is accessed, then a page bit is read from the array (step 506). In the illustrative embodiment, a determination is then made whether the page bit is equal to zero (step 508). If the page bit is equal to zero, then the data associated with that page bit is bypassed (step 502). If the page bit is equal to one, then the data associated with the page bit is read from the array (step 510). From there, all associated data flows to other parts of the data processing system for further processing (step 504), with the process termination thereafter.

The present invention provides for a method and apparatus for using a 2:1 MUX to control the three functions of read access, data bypass, and page size bypass in a memory array. An advantage of the mechanism of the present invention is that a 2:1 MUX uses less physical space on a processor chip than a 3:1 MUX. Another advantage is that logical control of a 2:1 MUX is less complicated than a 3:1 MUX. Another advantage is that a 2:1 MUX is faster than a 3:1 MUX. Thus, the mechanism of the present invention provides several architectural advantages when designing devices for managing data flow in a data processing system.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An 2:1 muxing mechanism for managing flow of data in a data processing system, said 2:1 muxing mechanism comprising:
   a 2:1 multiplexer, wherein the 2:1 multiplexer manages only two available control functions, wherein one of the only two available control functions is chosen from a bypass function and an array read function, and wherein the bypass function combines a regular bypass functionality and a page bit bypass functionality, and wherein the array read function reads data associated with a page bit into an array;
   a page bit bypass signal, wherein the page bit bypass signal is set to a default value, wherein the page bit bypass signal maintains the default value when the data in the array is not accessed, wherein the regular bypass functionality of the bypass function is activated if the page bit bypass signal maintains the default value, wherein the page bit bypass signal does not maintain the default value when the data in the array is accessed, and wherein the page bit bypass functionality of the bypass function is activated if the page bit bypass signal does not maintain the default value and the page bit has a value equal to a first value;
   an array read signal, wherein the array read signal activates the array read function if the page bit bypass signal does not maintain the default value and the page bit has a value not equal to the first value;
   an array read control signal mechanism, wherein the array read control signal mechanism is operably connected to the 2:1 multiplexer, and wherein the array read control signal mechanism provides the array read signal to the 2:1 multiplexer; and
   a page bit bypass control mechanism, wherein the page bit bypass control signal mechanism is operably connected to the 2:1 multiplexer, wherein the page bit bypass control signal mechanism is also operably connected to the array read control signal mechanism and wherein the page bit bypass control signal mechanism provides the page bit bypass signal to the 2:1 multiplexer.

2. A data processing system comprising:
   a bus;
   a processor operably connected to the bus;
   a memory comprising an array of memory cells, said memory operably connected to the bus; and
   a 2:1 multiplexer operably connected to the bus, said 2:1 multiplexer to manage only two available control functions, wherein one of the only two available control functions is chosen from a bypass function and an array read function, wherein the bypass function combines a regular bypass functionality and a page bit bypass functionality, and wherein the array read function reads data associated with a page bit into an array;
   a page bit bypass signal, wherein the page bit bypass signal is set to a default value, wherein the page bit bypass signal maintains the default value when the data in the array is not accessed, wherein the regular bypass functionality of the bypass function is activated if the page bit bypass signal maintains the default value, wherein the page bit bypass signal does not maintain the default value when the data in the array is accessed, and wherein the page bit bypass functionality of the bypass function is activated if the page bit bypass signal does not maintain the default value and the page bit has a value equal to a first value;
   an array read signal, wherein the array read signal activates the array read function if the page bit bypass signal does not maintain the default value and the page bit has a value not equal to the first value;
   an array read control signal mechanism, wherein the array read control signal mechanism is operably connected to the 2:1 multiplexer, and wherein the array read control signal mechanism provides the array read signal to the 2:1 multiplexer; and
   a page bit bypass control mechanism, wherein the page bit bypass control signal mechanism is operably connected to the 2:1 multiplexer, wherein the page bit bypass control signal mechanism is also operably connected to the array read control signal mechanism and wherein the page bit bypass control signal mechanism provides the page bit bypass signal to the 2:1 multiplexer.

3. A method of controlling flow of data in a data processing system using a 2:1 multiplexer, said method comprising:
   determining, by the 2:1 multiplexer, whether an array of memory has been accessed;
   initiating, by the 2:1 multiplexer, only two available control signals, wherein one of the only two available control signals is chosen from an array read signal and a page bit bypass signal;
   activating, by the 2:1 multiplexer, based on the only two available control signals, only two available control functions, wherein one of the only two available control functions is chosen from an array read function and a page bit bypass function, and wherein the page bit bypass function combines a regular bypass functionality and a page bit bypass functionality;

bypassing, by the 2:1 multiplexer, the data past the array if the array is not accessed using the regular bypass functionality of the page bit bypass function;

reading, by the 2:1 multiplexer, a page bit from the array if the array is accessed;

thereafter, determining, by the 2:1 multiplexer, whether the page bit is equal to a first value;

bypassing, by the 2:1 multiplexer, the data past the array if the page bit is equal to the first value using the page bit bypass functionality of the page bit bypass function; and performing, by the 2:1 multiplexer, an operation on array data from the array if the page bit is not equal to the first value, wherein performing the operation on the array data from the array comprises reading the array data using the array read function.

* * * * *